(12) United States Patent
Nakayama et al.

(10) Patent No.: US 11,742,020 B2
(45) Date of Patent: Aug. 29, 2023

(54) STORAGE DEVICE

(71) Applicant: KIOXIA CORPORATION, Tokyo (JP)

(72) Inventors: Masahiko Nakayama, Kuwana Mie (JP); Kazumasa Sunouchi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 165 days.

(21) Appl. No.: 17/461,858

(22) Filed: Aug. 30, 2021

(65) Prior Publication Data

US 2022/0301621 A1 Sep. 22, 2022

(30) Foreign Application Priority Data

Mar. 16, 2021 (JP) .................................. 2021-042453

(51) Int. Cl.
*G11C 11/00* (2006.01)
*G11C 11/56* (2006.01)
*G11C 13/00* (2006.01)

(52) U.S. Cl.
CPC .......... *G11C 13/004* (2013.01); *G11C 13/003* (2013.01); *G11C 13/0028* (2013.01); *G11C 13/0069* (2013.01)

(58) Field of Classification Search
CPC . G11C 13/004; G11C 13/0028; G11C 13/003; G11C 13/0069; G11C 11/1655; G11C 11/1657; G11C 11/1659; G11C 11/1673; G11C 11/161
See application file for complete search history.

(56) References Cited

U.S. PATENT DOCUMENTS

| 6,504,752 | B2 | 1/2003 | Ito |
| 6,747,891 | B2 | 6/2004 | Hoffmann et al. |
| 7,916,556 | B2 | 3/2011 | Kitagawa et al. |
| 7,944,729 | B2 | 5/2011 | Chen et al. |
| 9,812,499 | B1 | 11/2017 | Satoh et al. |
| 2009/0122598 | A1* | 5/2009 | Toda .................. G11C 13/0028 365/158 |
| 2009/0141544 | A1 | 6/2009 | Sakimura et al. |

(Continued)

FOREIGN PATENT DOCUMENTS

| JP | 3842217 B2 | 11/2006 |
| JP | 3920565 B2 | 5/2007 |

(Continued)

*Primary Examiner* — Hien N Nguyen
(74) *Attorney, Agent, or Firm* — Kim & Stewart LLP (57) ABSTRACT

A storage device includes a memory cell array in which a plurality of memory cells respectively including a variable resistance memory element are divided into a plurality of memory blocks, the plurality of memory cells including a first memory cell and a second memory cell that are in the same memory block, and a detection circuit. During a read operation in which the first memory cell is a read target, the detection circuit compares a first resistance value, which is a resistance value of the variable resistance memory element in the first memory cell, with a second resistance value, which is a resistance value of the variable resistance memory element in the second memory cell, and determines a value of data stored in the first memory cell based on whether or not the first resistance value is higher or lower than the second resistance value.

20 Claims, 8 Drawing Sheets

(56) References Cited

U.S. PATENT DOCUMENTS

| | | | |
|---|---|---|---|
| 2012/0081946 A1* | 4/2012 | Kawabata | G11C 13/0007 365/148 |
| 2016/0012890 A1* | 1/2016 | Park | G11C 11/5607 365/148 |
| 2019/0088328 A1 | 3/2019 | Antonyan | |
| 2020/0160901 A1 | 5/2020 | Boujamaa et al. | |
| 2022/0084588 A1* | 3/2022 | Okawa | G11C 13/0028 |
| 2022/0293171 A1* | 9/2022 | Nakayama | G11C 13/0038 |

FOREIGN PATENT DOCUMENTS

| | | |
|---|---|---|
| JP | 4371149 B2 | 11/2009 |
| TW | 202034625 A | 9/2020 |

* cited by examiner

STORAGE DEVICE

CROSS-REFERENCE TO RELATED APPLICATION

This application is based upon and claims the benefit of priority from Japanese Patent Application No. 2021-042453, filed Mar. 16, 2021, the entire contents of which are incorporated herein by reference.

FIELD

Embodiments described herein relate generally to a storage device.

BACKGROUND

In some non-volatile storage devices, variable resistance memory elements such as a magnetoresistance effect element or the like are integrated therein.

DETAILED DESCRIPTION

Embodiments provide a storage device capable of performing an efficient read operation.

In general, according to one embodiment, a storage device includes a memory cell array in which a plurality of memory cells respectively including a variable resistance memory element are divided into a plurality of memory blocks, the plurality of memory cells including a first memory cell and a second memory cell that are in the same memory block, and a detection circuit. During a read operation in which the first memory cell is a read target, the detection circuit compares a first resistance value, which is a resistance value of the variable resistance memory element in the first memory cell, with a second resistance value, which is a resistance value of the variable resistance memory element in the second memory cell, and determines a value of data stored in the first memory cell based on whether or not the first resistance value is higher or lower than the second resistance value.

Hereinafter, embodiments will be described with reference to the drawings.

First Embodiment

Figure 1:
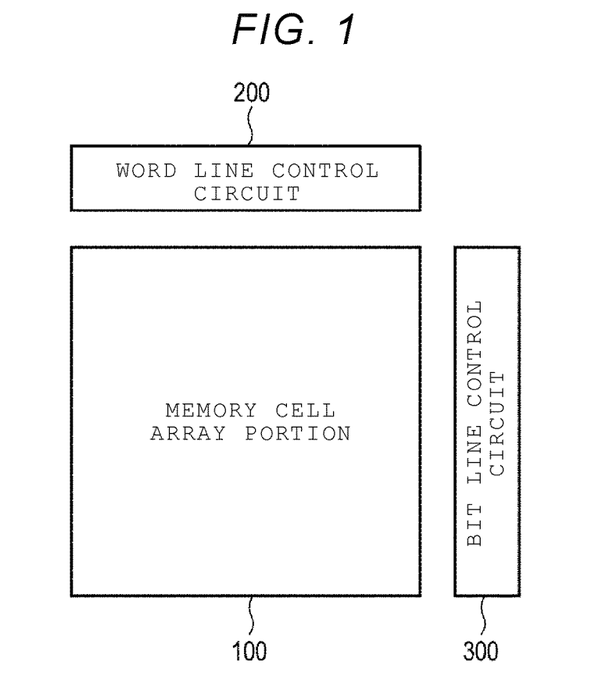
FIG. 1 is a block diagram illustrating an overall schematic configuration of a storage device according to a first embodiment.

FIG. 1 is a block diagram illustrating an overall schematic configuration of a non-volatile storage device according to a first embodiment. In the following description, a magnetic storage device will be described as an example of the storage device.

The magnetic storage device of the present embodiment includes a memory cell array portion 100, a word line control circuit 200, and a bit line control circuit 300. One memory unit includes the memory cell array portion 100, the word line control circuit 200, and the bit line control circuit 300 illustrated in FIG. 1, and the magnetic storage device includes a plurality of such memory units.

Figure 2:
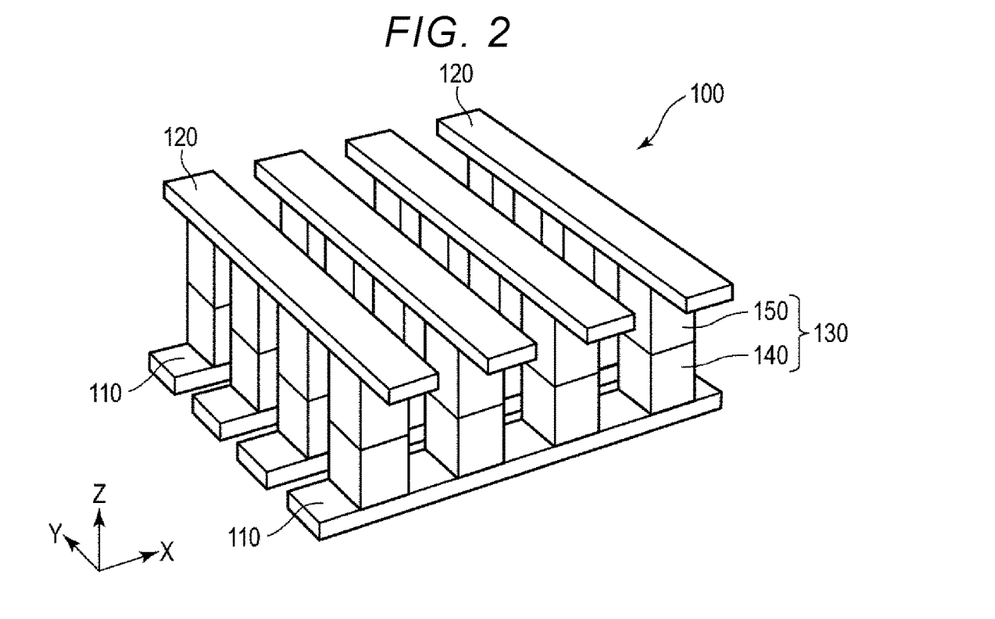
FIG. 2 is a perspective view schematically illustrating a configuration of a memory cell array portion of the storage device according to the first embodiment.

FIG. 2 is a perspective view schematically illustrating a configuration of the memory cell array portion 100.

The memory cell array portion 100 is provided on a lower area (not illustrated) including a semiconductor substrate (not illustrated), and includes a plurality of word lines 110, a plurality of bit lines 120 crossing above the plurality of word lines 110, and a plurality of memory cells 130 connected between the plurality of word lines 110 and the plurality of bit lines 120.

X, Y, and Z directions illustrated in the drawing are directions that intersect each other. More specifically, the X, Y, and Z directions are orthogonal to each other.

The word line 110 and the bit line 120 supply a predetermined signal to the memory cell 130 when performing writing or reading with respect to the memory cell 130. In FIG. 2, while the word line 110 is located on a lower layer side and the bit line 120 is located on an upper layer side, the word line 110 may be located on the upper layer side and the bit line 120 may be located on the lower layer side.

The memory cell 130 includes a magnetoresistance effect element 140 which is a non-volatile variable resistance memory element, and a selector (also referred to as a switching element) 150 connected in series to the magnetoresistance effect element 140.

In FIG. 2, while the magnetoresistance effect element 140 is located on a lower layer side and the selector 150 is located on an upper layer side, the magnetoresistance effect element 140 may be located on the upper layer side and the selector 150 may be located on the lower layer side.

Figure 3:
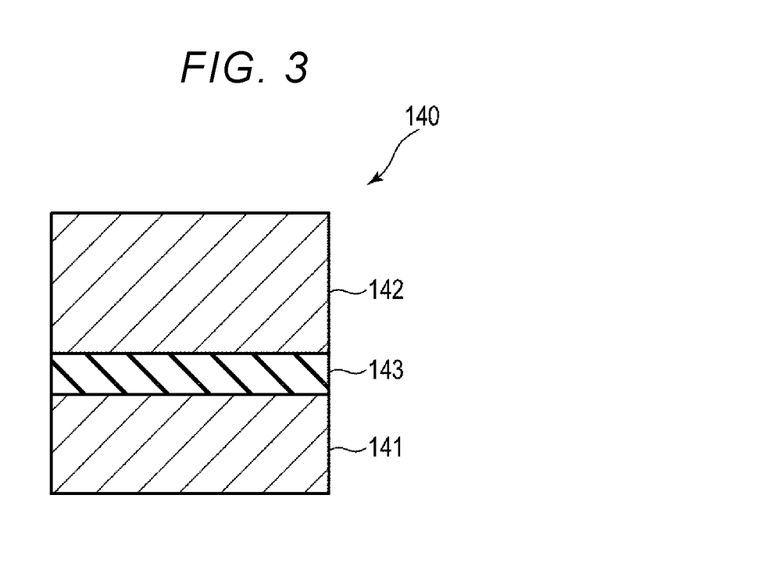
FIG. 3 is a cross-sectional view schematically illustrating a configuration of a magnetoresistance effect element of the storage device according to the first embodiment.

FIG. 3 is a cross-sectional view schematically illustrating a configuration of the magnetoresistance effect element 140.

The magnetoresistance effect element 140 of the present embodiment is a magnetic tunnel junction (MTJ) element, and includes a storage layer (also referred to as a first magnetic layer) 141, a reference layer (also referred to as a second magnetic layer) 142, and a tunnel barrier layer (also referred to as a non-magnetic layer) 143.

The storage layer 141 is a ferromagnetic layer having a variable magnetization direction. The variable magnetization direction indicates that a magnetization direction changes with respect to a predetermined write current. The storage layer 141 is formed of, for example, a CoFeB layer containing cobalt (Co), iron (Fe) and boron (B).

The reference layer 142 is a ferromagnetic layer having a fixed magnetization direction. The fixed magnetization direction indicates that the magnetization direction does not change with respect to the predetermined write current. For example, the reference layer 142 is formed of the CoFeB layer containing cobalt (Co), iron (Fe) and boron (B), cobalt (Co), and a superlattice layer of a predetermined element selected from platinum (Pt), nickel (Ni) and palladium (Pd).

The tunnel barrier layer 143 is an insulating layer provided between the storage layer 141 and the reference layer 142. The tunnel barrier layer 143 is formed of, for example, an MgO layer containing magnesium (Mg) and oxygen (O).

When the magnetization direction of the storage layer 141 is parallel to the magnetization direction of the reference layer 142, the magnetoresistance effect element 140 is in a low resistance state in which resistance is relatively low. When the magnetization direction of the storage layer 141 is anti-parallel to the magnetization direction of the reference layer 142, the magnetoresistance effect element 140 is in a high resistance state in which resistance is relatively high. Therefore, the magnetoresistance effect element 140 can store binary data according to the resistance state (the low resistance state and the high resistance state). The magnetoresistance effect element 140 can be set to the low resistance state or the high resistance state according to a direction of the write current.

The magnetoresistance effect element 140 of the present embodiment is a spin transfer torque (STT) type magnetoresistance effect element and has perpendicular magnetization. That is, the magnetization direction of the storage layer 141 is perpendicular to a film surface of the storage layer 141, and the magnetization direction of the reference layer 142 is perpendicular to a film surface of the reference layer 142.

While the magnetoresistance effect element 140 illustrated in FIG. 3 has a bottom-free type structure in which the storage layer 141 is located on the lower layer side and the reference layer 142 is located on the upper layer side, the present embodiment may use a magnetoresistance effect element having a top-free type structure in which the storage layer 141 is located on the upper layer side and the reference layer 142 is located on the lower layer side.

Figure 4:
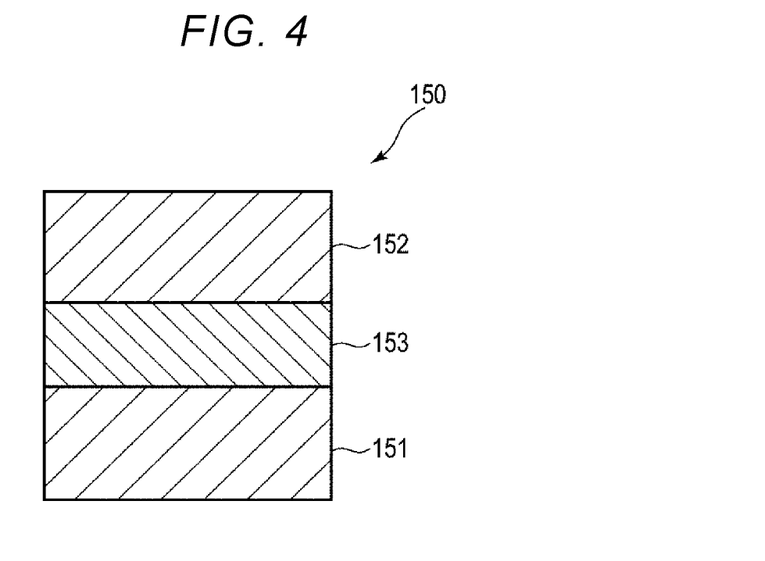
FIG. 4 is a cross-sectional view schematically illustrating a configuration of a selector of the storage device according to the first embodiment.

FIG. 4 is a cross-sectional view schematically illustrating a configuration of the selector 150.

The selector 150 includes a lower electrode 151, an upper electrode 152, and a selector material layer (also referred to as a switching material layer) 153 located between the lower electrode 151 and the upper electrode 152. The selector 150 is a two-terminal type switching element, and has a nonlinear current-voltage characteristic. When a voltage applied between two terminals of the selector 150 is less than a threshold voltage, the selector 150 is in a high resistance state, for example, in an electrically non-conductive state. On the other hand, when the voltage applied between the two terminals thereof is equal to or higher than the threshold voltage, the selector 150 is in a low resistance state, for example, in an electrically conductive state.

Figure 5:
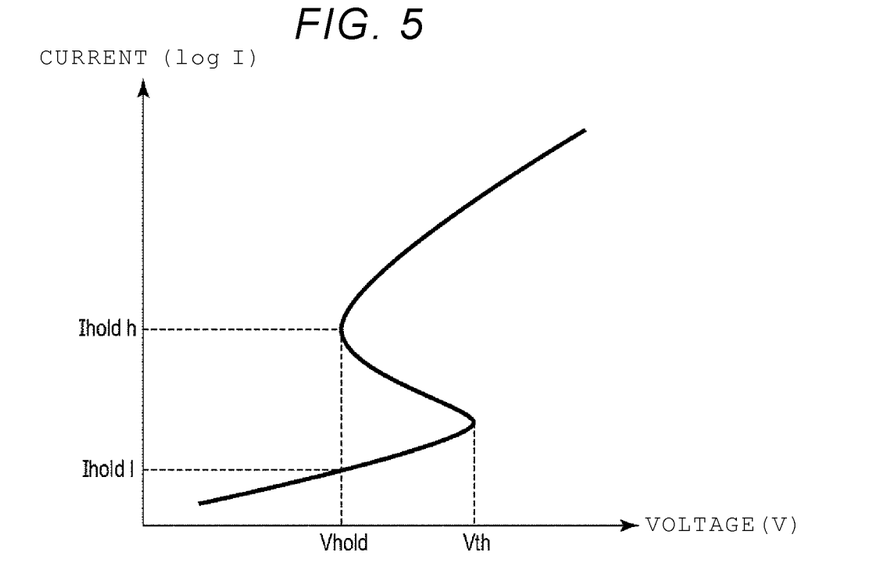
FIG. 5 is a diagram schematically illustrating an example of a current-voltage characteristic of the selector of the storage device according to the first embodiment.

FIG. 5 is a diagram schematically illustrating an example of the current-voltage characteristic of the selector 150. When the voltage between the two terminals of the selector 150 rises and reaches a threshold voltage Vth, a current flowing between the two terminals thereof significantly increases. When the voltage between the two terminals thereof decreases and reaches a hold voltage Vhold, the current flowing between the two terminals thereof shifts from a hold current Iholdh to a hold current Iholdl.

By applying a voltage equal to or higher than a predetermined voltage between the word line 110 and the bit line 120, the selector 150 is turned on (in the conductive state), thereby making it possible to perform writing or reading with respect to the magnetoresistance effect element 140 connected in series to the selector 150.

Figure 6:
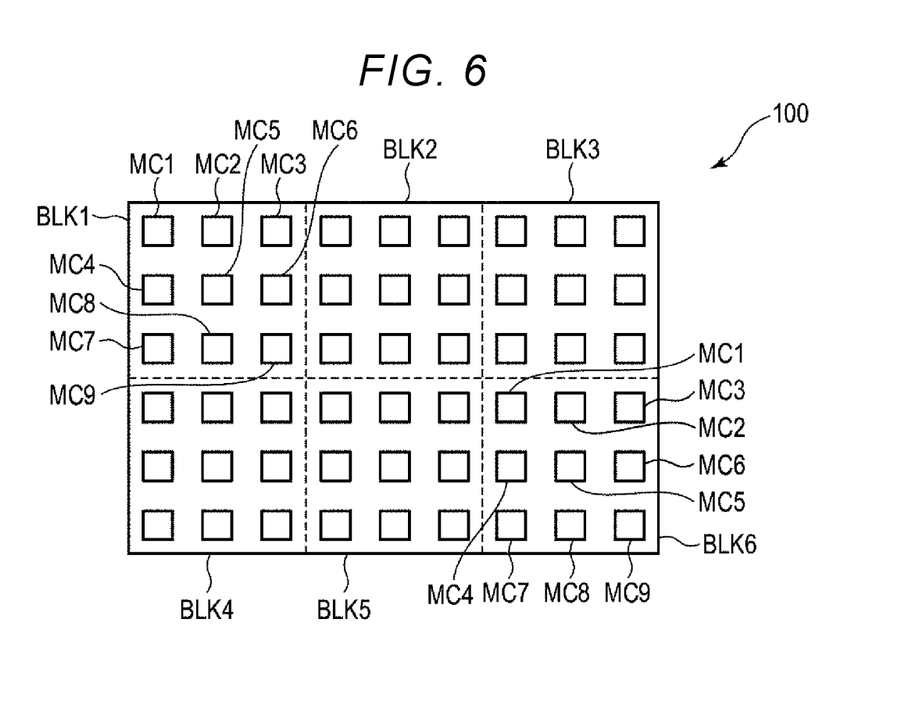
FIG. 6 is a diagram illustrating a specific configuration and an operation of the storage device according to the first embodiment.

FIG. 6 is a diagram illustrating a specific configuration and an operation of the magnetic storage device according to the present embodiment, and is a diagram schematically illustrating a configuration of the memory cell array portion 100.

The memory cell array portion 100 has a configuration in which a plurality of memory cells MC, e.g., MC1 to MC9 (each corresponding to memory cell 130) are disposed in an array shape, and includes a plurality of memory cell blocks BLK (BLK1 to BLK6). Each of the memory cell blocks BLK1 to BLK6 includes a plurality of memory cells MC1 to MC9. In FIG. 6, six memory cell blocks BLK1 to BLK6 are illustrated for simplifying the description thereof. However, the number of memory cell blocks BLK provided in one memory cell array portion 100 is not limited to six. In addition, the memory cell array portion 100 is depicted in FIG. 6 (and in FIGS. 8, 10, and 12) as viewed along the Z direction shown in FIG. 2 and thus the location of each of the memory cells MC is at an intersection of one of the word lines 110 (not shown in FIG. 6) and one of the bit lines 120 (not shown in FIG. 6).

The memory cell blocks BLK1 to BLK6 are defined by dividing the memory cell array in a grid shape, and in each of the memory cell blocks BLK1 to BLK6, the memory cells MC1 to MC9 are provided at locations close to each other. In the example illustrated in FIG. 6, while one memory cell block BLK includes nine memory cells MC, the number of memory cells MC provided in one memory cell block BLK is not limited to nine.

In each of the memory cell blocks BLK1 to BLK6, the memory cells MC1 to MC9 include a reference memory cell. The reference memory cell is set in the center of each of the memory cell blocks BLK1 to BLK6. In the present embodiment, the memory cell MC5 functions as the reference memory cell. The reference memory cell stores reference data to be used when reading data stored in a detection target memory cell (any one of MC1, MC2, MC3, MC4, MC6, MC7, MC8, and MC9) provided in the memory cell block BLK including the reference memory cell (belonging to the memory cell block BLK). Specifically, the reference memory cell stores data based on a resistance state of a reference magnetoresistance effect element provided in the reference memory cell as reference data. More specifically, as the reference resistance state of the reference magnetoresistance effect element, a low resistance state or a high resistance state is set in the reference magnetoresistance effect element.

Figure 7:
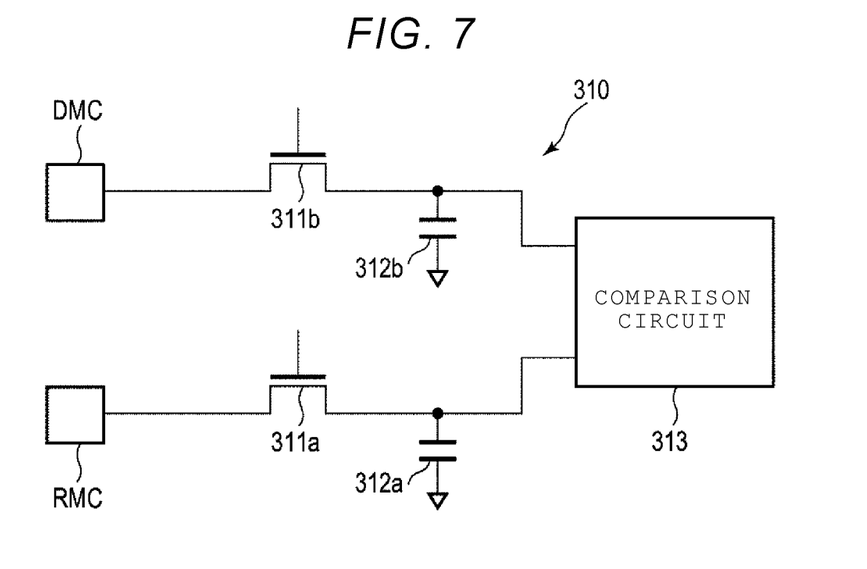
FIG. 7 is a diagram illustrating a configuration of a detection circuit of the storage device according to the first embodiment.

FIG. 7 is a diagram illustrating a configuration of a detection circuit used when reading the data stored in the detection target memory cell.

A detection circuit 310 includes transistors 311a and 311b, capacitors 312a and 312b, and a comparison circuit 313 configured with a sense amplifier or the like.

The detection circuit 310 is provided in the bit line control circuit 300 illustrated in FIG. 1, and detects a resistance state set in a detection target magnetoresistance effect element provided in a detection target memory cell. Specifically, the detection circuit 310 compares a detection target value based on a resistance value of a detection target magnetoresistance effect element provided in the detection target memory cell DMC with a reference value based on a resistance value of a reference magnetoresistance effect element provided in the reference memory cell RMC provided in the memory cell block BLK to which the detection target memory cell DMC belongs, thereby detecting the resistance state set in the detection target magnetoresistance effect element.

A read operation of the present embodiment is carried out as follows.

From a time point of t1 to a time point of t2, the transistor 311a is in an ON state, and a reference voltage corresponding to the resistance value of the reference magnetoresistance effect element provided in the reference memory cell RMC is stored in the capacitor 312a as the reference value.

From a time point of t3 to a time point of t4, the transistor 311b is in an ON state, and a detection target voltage corresponding to the resistance value of the detection target magnetoresistance effect element provided in the detection target memory cell DMC is stored in the capacitor 312b as the detection target value.

The comparison circuit 313 compares the detection target voltage obtained as described above with the reference voltage, and a comparison result is obtained at a time point of t5. Based upon the comparison result, the resistance state set in the detection target magnetoresistance effect element is determined. That is, when a difference between the detection target voltage and the reference voltage is smaller than a predetermined value, it is determined that the resistance state set in the detection target magnetoresistance effect element is in the same resistance state as the resistance state set in the reference magnetoresistance effect element. When the difference between the detection target voltage and the reference voltage is greater than the predetermined value, it is determined that the resistance state set in the detection target magnetoresistance effect element is in a resistance state different from the resistance state set in the reference magnetoresistance effect element.

By the above-described configuration and read method, an efficient read operation can be performed in the present embodiment. Hereinafter, the description will be added.

Self-reference reading is known as a related-art read method. In the self-reference reading, first, in a first step, detection target data stored in the detection target memory cell is read. Continuously, in a second step, predetermined reference data is written to the detection target memory cell. After that, in a third step, the reference data written in the second step is read, and the detection target data read in the first step is compared with the reference data read in the third step. Based upon a comparison result obtained in this manner, the detection target data is determined.

The above-described self-reference reading requires a total of 3 steps, such that it is difficult to perform a quick read operation.

In the present embodiment, since the read operation can be performed in two steps including the reference data read step and the detection target data read step, quick reading can be performed such that an efficient read operation can be performed.

In the present embodiment, the reference memory cell RMC is set for each memory cell block BLK, and the data set in the detection target memory cell DMC is detected by using the reference memory cell RMC provided in the memory cell block BLK to which the detection target memory cell DMC belongs. Therefore, as described below, the data can be detected with high accuracy.

In each memory cell block BLK, the memory cells MC1 to MC9 including the reference memory cell RMC are provided at locations close to each other, such that it is considered that the detection target memory cell DMC and the reference memory cell RMC provided in the same memory cell block BLK have substantially the same characteristics. Therefore, the detection target value based on the detection target resistance state can be compared with the reference value based on the reference resistance state with high accuracy, thereby making it possible to detect the data with high accuracy.

A modified read operation of the present embodiment is carried out as follows.

First, from a time point of t1 to a time point of t2, the reference data set in the reference memory cell RMC (for example, the memory cell MC5 in the memory cell block BLK1 of FIG. 6) is read and stored as the reference voltage.

From a time point of t3 to a time point of t4, the detection target data stored in the detection target memory cell DMC (for example, the memory cell MC1 in the memory cell block BLK1 of FIG. 6) is read and stored as the detection target voltage.

The comparison circuit 313 compares the detection target voltage obtained as described above with the reference voltage, a comparison result is obtained at a time point of t5, and the resistance state set in the detection target magnetoresistance effect element (for example, the magnetoresistance effect element in the memory cell MC1 in the memory cell block BLK1 of FIG. 6) is determined.

From a time point of t5 to a time point of t6, detection target data stored in the other detection target memory cell DMC (for example, the memory cell MC2 in the memory cell block BLK1 of FIG. 6) provided in the memory cell block BLK1 to which the above-described detection target memory cell DMC (for example, the memory cell MC1 in the memory cell block BLK1 of FIG. 6) belongs is read and stored as the detection target voltage.

The comparison circuit 313 compares the detection target voltage obtained as described above with the reference voltage, a comparison result is obtained at a time point of t7, and the resistance state set in the detection target magnetoresistance effect element (for example, a magnetoresistance effect element in the memory cell MC2 in the memory cell block BLK1 of FIG. 6) is determined.

After that, the same operation as described above is repeatedly performed for the memory cells MC3, MC4, MC6, MC7, MC8, and MC9 in the memory cell block BLK1, thereby making it possible to acquire the detection target data set in the memory cells MC3, MC4, MC6, MC7, MC8, and MC9.

As described above, in the present modification, the data stored in the plurality of memory cells MC in the memory cell block BLK are sequentially read, such that the reference data set in the reference memory cell RMC can be used as common reference data. Therefore, the data stored in the plurality of memory cells MC can be determined only by reading the reference data from the reference memory cell RMC once. Therefore, a more efficient read operation can be performed.

In the present embodiment, the reference memory cell RMC may be changed in the same memory cell block BLK. For example, when the number of times of reading reaches a predetermined number of times in the same memory cell array portion or the same memory cell block, the reference memory cell RMC may be changed (for example, the reference memory cell RMC is changed from MC5 to MC6). The number of times of reading (the number of times of access) of the memory cells MC1 to MC9 provided in the same memory cell block BLK can be averaged by changing the reference memory cell RMC in this manner, such that it is possible to increase lifetime of all the memory cells MC.

In the present embodiment, the resistance state set in the reference memory cell RMC may be changed (a change from the low resistance state to the high resistance state, or a change from the high resistance state to the low resistance state). For example, when the number of times of reading reaches the predetermined number in the same memory cell array portion or the same memory cell block, the resistance state set in the reference memory cell RMC may be changed.

Second Embodiment

Next, a second embodiment will be described. The basic description is the same as those of the first embodiment described above, and description of the matters described in the first embodiment will not be repeated here.

Figure 8:
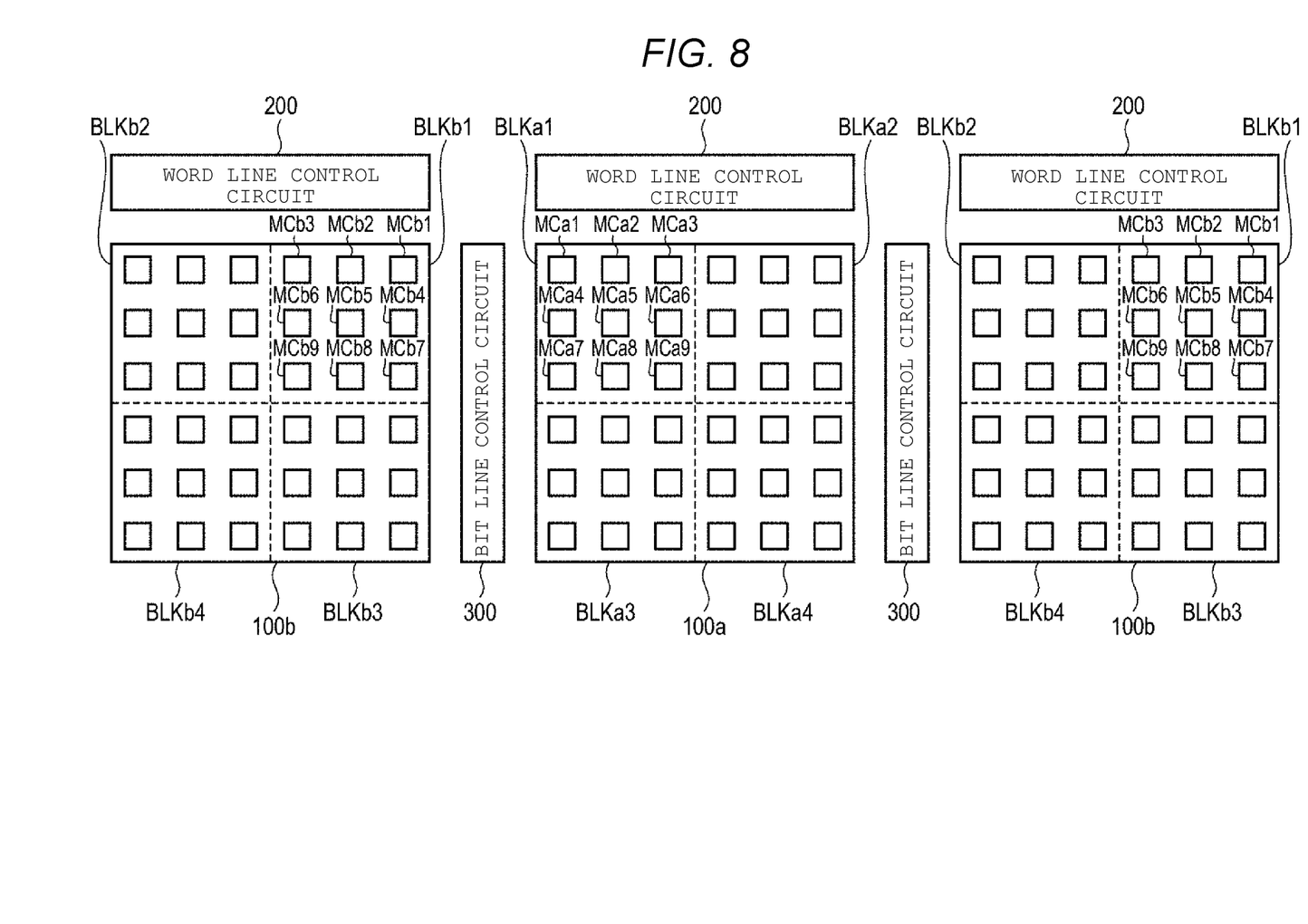
FIG. 8 is a diagram illustrating a specific configuration and an operation of a storage device according to a second embodiment.

FIG. 8 is a diagram illustrating a specific configuration and an operation of a magnetic storage device according to the present embodiment.

The magnetic storage device of the present embodiment includes a reference memory cell array portion (also referred to as a first memory cell array portion) 100a and a detection target memory cell array portion (also referred to as a second memory cell array portion) 100b.

Basic configurations of the reference memory cell array portion 100a and the detection target memory cell array portion 100b are the same as the configuration of the memory cell array portion 100 described in the first embodiment. The reference memory cell array portion 100a and the detection target memory cell array portion 100b have configurations equivalent to each other.

The reference memory cell array portion 100a includes a plurality of memory cell blocks BLKa (BLKa1 to BLKa4). Each of the plurality of memory cell blocks BLKa includes a plurality of memory cells MCa (MCa1 to MCa9) including a reference memory cell.

The detection target memory cell array portion 100b includes a plurality of memory cell blocks BLKb (BLKb1 to BLKb4). Each of the plurality of memory cell blocks BLKb includes a plurality of memory cells MCb (MCb1 to MCb9).

The number of memory cell blocks provided in one memory cell array portion and the number of memory cells provided in one memory cell block are not limited those illustrated herein.

Figure 9:
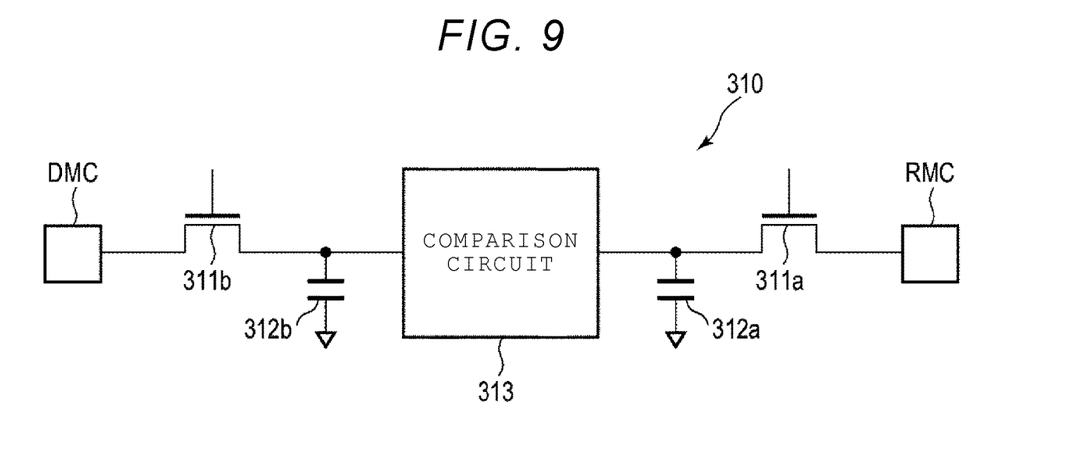
FIG. 9 is a diagram illustrating a configuration of a detection circuit of the storage device according to the second embodiment.

FIG. 9 is a diagram illustrating a configuration of a detection circuit of the present embodiment.

The detection circuit 310 includes the transistors 311a and 311b, the capacitors 312a and 312b, and the comparison circuit 313 configured with the sense amplifier or the like.

The detection circuit 310 is provided in the bit line control circuit 300 located between the reference memory cell array portion 100a and the detection target memory cell array portion 100b. The basic configuration of the detection circuit 310 is the same as the configuration of the detection circuit 310 illustrated in FIG. 7 of the first embodiment. The detection circuit 310 detects the resistance state set in the detection target magnetoresistance effect element provided in the detection target memory cell DMC. Specifically, the detection circuit 310 compares the detection target value based on the resistance value of the detection target magnetoresistance effect element provided in the detection target memory cell DMC with the reference value based upon the resistance value of the reference magnetoresistance effect element provided in the reference memory cell RMC, thereby detecting the resistance state set in the detection target magnetoresistance effect element.

The bit line control circuit 300 illustrated in FIG. 8 is commonly used by the reference memory cell array portion 100a and the detection target memory cell array portion 100b that are adjacent to each other in a state where the bit line control circuit 300 is interposed therebetween. For example, when reading data of the memory cell MCb provided in the detection target memory cell array portion 100b on the left side of FIG. 8, the detection circuit 310 provided in the common bit line control circuit 300 compares the data of the memory cell MCb with reference data of the memory cell MCa provided in the reference memory cell array portion 100a of FIG. 8.

A location of the reference memory cell block BLKa including the reference memory cell RMC (belonging to the reference memory cell block BLKa) in the reference memory cell array portion 100a, and a location of the memory cell block BLKb including the detection target memory cell DMC (belonging to the memory cell block BLKb) in the detection target memory cell array portion 100b correspond to each other. For example, when the detection target memory cell DMC is provided in a memory cell block BLKbn (n=1, 2, 3 or 4), the reference memory cell RMC is provided in a reference memory cell block BLKan (n=1, 2, 3 or 4).

Therefore, for example, when reading the data of the memory cell MCb (DMC) provided in the memory cell block BLKb1 of the detection target memory cell array portion 100b on the left side of FIG. 9, the memory cell MCa provided in the memory cell block BLKa1 of the reference memory cell array portion 100a is used as the reference memory cell RMC. That is, the memory cell block BLKa1 to which the above-described reference memory cell RMC belongs and the memory cell block BLKb1 to which the detection target memory cell DMC belongs are set at locations equivalent to each other in a state where the bit line control circuit 300 is interposed therebetween, in other words, locations to be mirrored with respect to the bit line control circuit 300.

The reference memory cell RMC may be set in advance in the memory cell block BLKa to which the reference memory cell RMC belongs. In this case, for example, the reference memory cell is set in the center of each of the memory cell blocks BLKa1 to BLKa4. In the present embodiment, the memory cell MCa5 functions as a reference memory cell. Therefore, for example, when reading the data of the memory cell MCb provided in the memory cell block BLKb of the detection target memory cell array portion 100b, the memory cell MCa5 provided in the memory cell block BLKa of the reference memory cell array portion 100a is used as the reference memory cell RMC even when any one of MCb1 to MCb9 is selected as the detection target memory cell DMC.

Alternatively, reference memory cell RMC may not be set in advance in the memory cell block BLKa to which the reference memory cell RMC belongs. Specifically, the detection target memory cell DMC and the reference memory cell RMC existing at the locations equivalent to each other in the state where the bit line control circuit 300 is interposed therebetween (the locations to be mirrored with respect to the bit line control circuit 300) may be caused to correspond to each other on a one-to-one basis. For example, when the memory cell MCb1 provided in the memory cell block BLKb1 is the detection target memory cell DMC, the memory cell MCa1 provided in the memory cell block BLKa1 is set as the reference memory cell RMC.

A read operation of the second embodiment is carried out as follows.

From a time point of t1 to a time point of t2, both the transistor 311a and the transistor 311b are in an ON state. Therefore, a reference voltage corresponding to the resistance value of the reference magnetoresistance effect element provided in the reference memory cell RMC is stored in the capacitor 312a as the reference value, and a detection target voltage corresponding to the resistance value of the detection target magnetoresistance effect element provided in the detection target memory cell DMC is stored in the capacitor 312b as the detection target value. That is, in the present embodiment, the reference value and the detection target value are detected in parallel.

The comparison circuit 313 compares the detection target voltage with the reference voltage obtained as described above, and a comparison result is obtained at a time point of t3. In the same manner as that of the first embodiment, the resistance state set in the detection target magnetoresistance effect element is determined based upon the obtained comparison result.

As described above, in the present embodiment, since the reference memory cell RMC and the detection target memory cell are provided in different memory cell array portions, the operation of reading the reference data and the operation of reading the detection target data can be performed in parallel, such that quick reading can be performed.

In the present embodiment, the reference memory cell array portion 100a and the detection target memory cell array portion 100b have configurations equivalent to each other, and the location of the reference memory cell block BLKa including the reference memory cell RMC (belonging to the reference memory cell block BLKa) in the reference memory cell array portion 100a and the location of the memory cell block BLKb including the detection target memory cell DMC (belonging to the memory cell block BLKb) in the detection target memory cell array portion 100b correspond to each other.

Therefore, in the present embodiment, a read path length between the reference memory cell RMC and the detection circuit 310 and a read path length between the detection target memory cell DMC and the detection circuit 310 can be almost the same, and parasitic resistance and parasitic capacitance in both read paths can be almost the same. Therefore, in the present embodiment, a read characteristic from the reference memory cell RMC and a read characteristic from the detection target memory cell DMC can be almost the same, thereby making it possible to detect the data with high accuracy.

Third Embodiment

Next, a third embodiment will be described. Basic matters are the same as those of the first embodiment described above, and description of the matters described in the first embodiment will be omitted.

Figure 10:
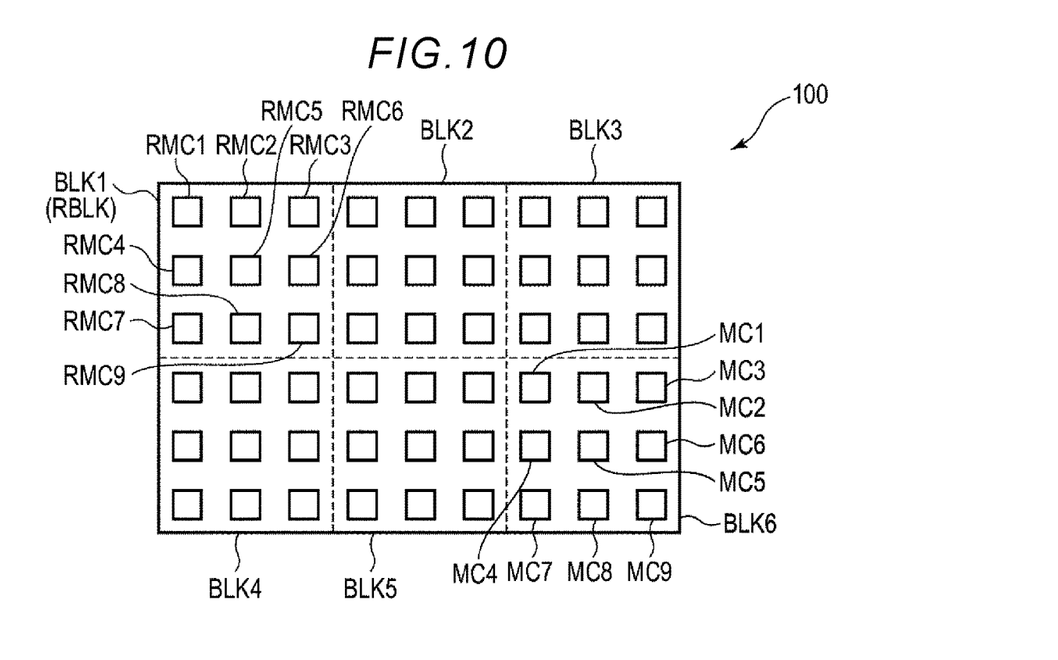
FIG. 10 is a diagram illustrating a specific configuration and an operation of a storage device according to a third embodiment.

FIG. 10 is a diagram illustrating a specific configuration and an operation of a magnetic storage device according to the present embodiment, and is a diagram schematically illustrating a configuration of the memory cell array portion 100.

The basic configuration of the memory cell array portion 100 is the same as the configuration of the memory cell array portion 100 described in the first embodiment. That is, the memory cell array portion 100 includes a plurality of memory cell blocks BLK (BLK1 to BLK6), and each of the plurality of memory cell blocks BLK includes a plurality of memory cells MC (MC1 to MC9).

In the present embodiment, a predetermined memory cell block of the plurality of memory cell blocks BLK provided in the memory cell array portion 100 functions as a reference memory cell block RBLK. In the example illustrated in FIG. 10, the memory cell block BLK1 functions as the reference memory cell block RBLK.

The reference memory cell block RBLK includes a plurality of reference memory cells RMC (RMC1 to RMC9), and the same resistance state is set as a reference resistance state in a magnetoresistance effect element provided in each of the plurality of reference memory cells RMC. That is, in the magnetoresistance effect elements provided in the reference memory cells RMC1 to RMC9, only one of the low resistance state and the high resistance state is set as the reference resistance state. The number of reference memory cells RMC provided in the reference memory cell block RBLK may be two or more.

Memory cell blocks BLK other than the reference memory cell block RBLK of the plurality of memory cell blocks BLK provided in the memory cell array portion 100 become detection target memory cell blocks. In the example illustrated in FIG. 10, the memory cell blocks BLK2 to BLK6 become the detection target memory cell blocks BLK.

In the present embodiment, a value based upon an average value of a plurality of resistance values of the magnetoresistance effect elements provided in the reference memory cells RMC1 to RMC9 is used as a reference value. Specifically, a value based upon a simple average value of the plurality of resistance values is used as the reference value.

Figure 11:
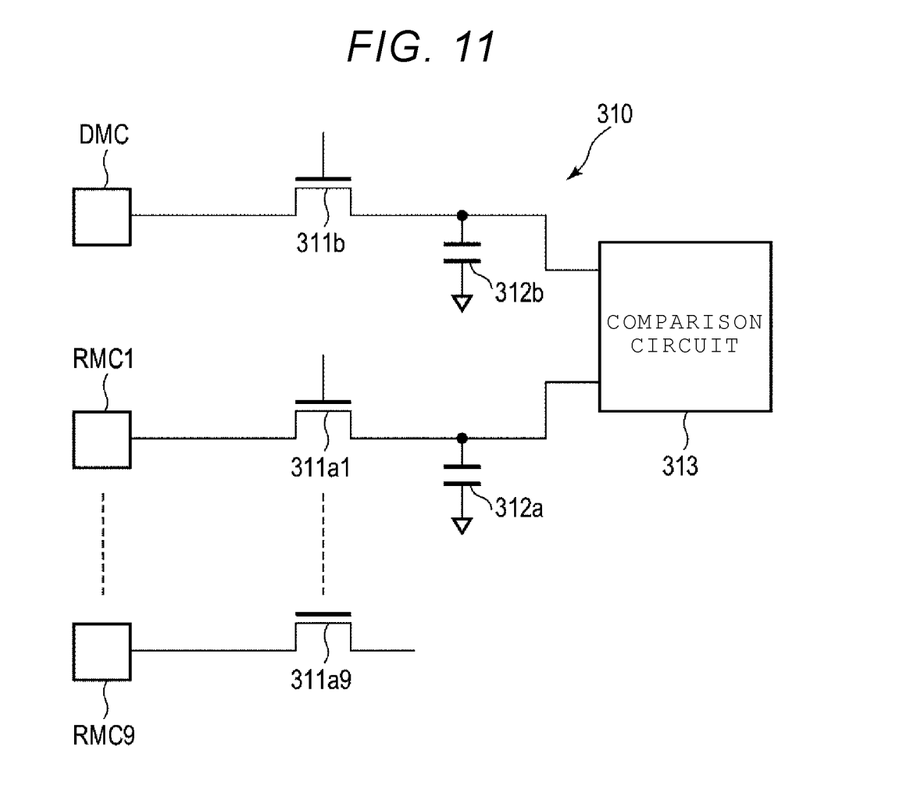
FIG. 11 is a diagram illustrating a configuration of a detection circuit of the storage device according to the third embodiment.

FIG. 11 is a diagram illustrating a configuration of a detection circuit of the present embodiment.

The detection circuit 310 includes the transistors 311a (311a1 to 311a9) and 311b, the capacitors 312a and 312b, and the comparison circuit 313 configured with the sense amplifier or the like. In the same manner as that of the first embodiment, the detection circuit 310 is provided in the bit line control circuit 300 illustrated in FIG. 1.

The detection circuit 310 compares the detection target value based upon the resistance value of the detection target magnetoresistance effect element provided in the detection target memory cell DMC with the reference value based upon the plurality of resistance values of the magnetoresistance effect elements provided in the plurality of reference memory cells RMC1 to RMC9 by using the comparison circuit 313, thereby detecting the resistance state set in the detection target magnetoresistance effect element.

A read operation of the third embodiment is carried out as follows.

From a time point of t1 to a time point of t2, all of the transistors 311a1 to 311a9 (refer to FIG. 11) are in an ON state, and a reference voltage corresponding to an average value of the resistance values of the reference magnetoresistance effect elements provided in the reference memory cells RMC1 to RMC9 is stored in the capacitor 312a as the reference value.

From a time point of t3 to a time point of t4, the transistor 311b is in an ON state, and a detection target voltage corresponding to the resistance value of the detection target magnetoresistance effect element provided in the detection target memory cell DMC is stored in the capacitor 312b as the detection target value.

The comparison circuit 313 compares the detection target voltage obtained as described above with the reference voltage, and a comparison result is obtained at a time point of t5. In the same manner as that of the first embodiment, the resistance state set in the detection target magnetoresistance effect element is determined based upon the obtained comparison result.

A modified read operation of the third embodiment is carried out as follows.

An operation from a time point of t1 to a time point of t2 is the same as described above, and the reference voltage corresponding to the average value of the resistance values of the reference magnetoresistance effect elements provided in the reference memory cells RMC1 to RMC9 is stored in the capacitor 312a as the reference value.

After a time point of t3, a sequential read operation of memory cells similar to the operation described above in the modified read operation of the first embodiment is performed, and the detection target data set in the detection target memory cells MC1 to MC9 provided in the detection target memory cell block are sequentially acquired.

When performing reading from a plurality of detection target memory cell blocks, the sequential read operation may be performed in the same manner for other detection target memory cell blocks after completing the sequential read operation for one detection target memory cell block.

As described above, in the present embodiment as well, an efficient read operation can be performed in the same manner as that of the first embodiment.

In the present embodiment, since a detection operation is performed by using the reference values based upon the plurality of resistance values of the magnetoresistance effect elements provided in the plurality of reference memory cells RMC, detection with high accuracy can be performed even though the resistance values of the plurality of reference memory cells RMC vary.

Figure 12:
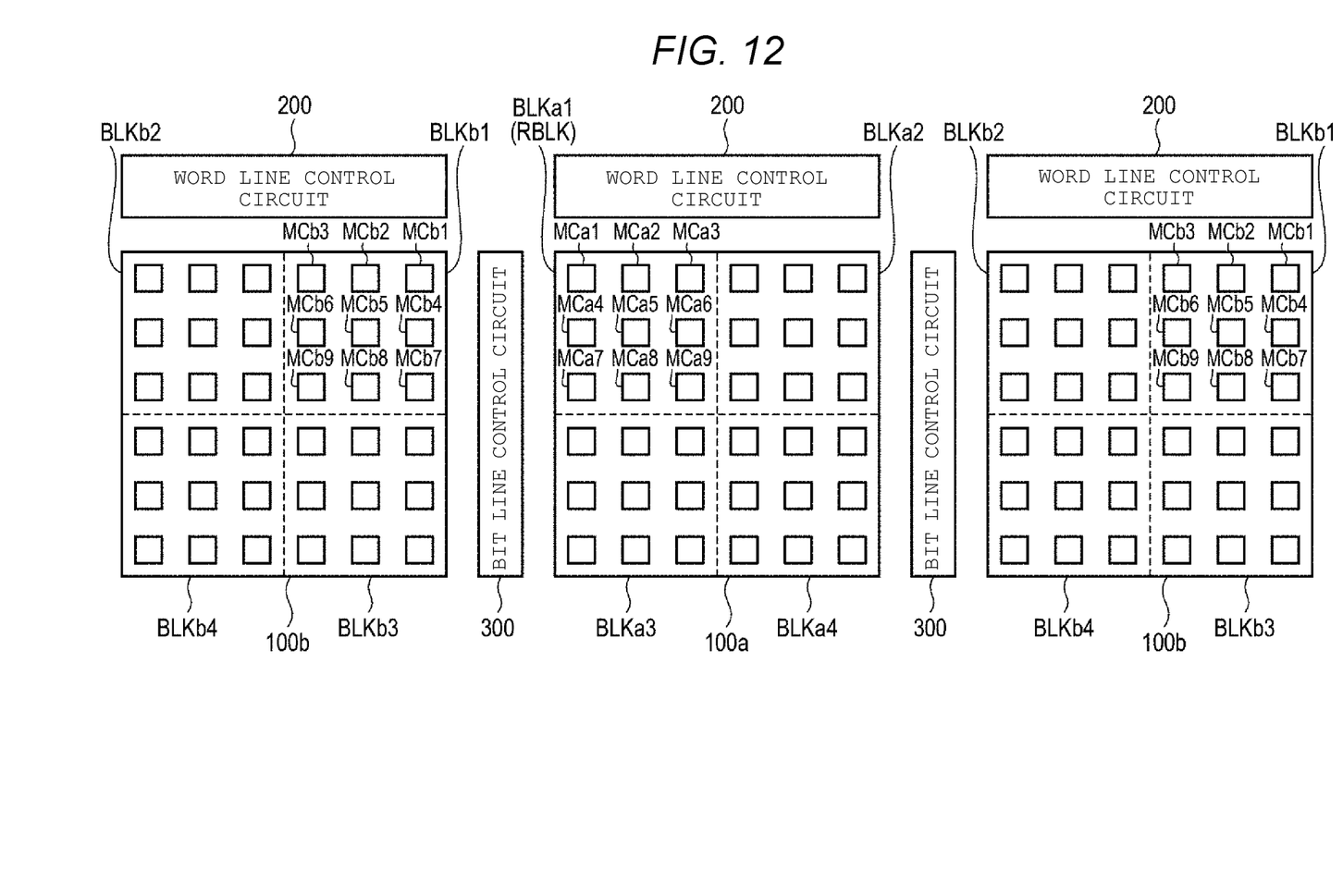
FIG. 12 is a diagram illustrating a configuration and an operation of a storage device according to a modification of the third embodiment.

FIG. 12 is a diagram illustrating a configuration and an operation of a magnetic storage device according to a modification of the third embodiment.

The present modification is performed by applying a concept of the third embodiment to the concept of the second embodiment. Therefore, description of the matters described in the second embodiment will be omitted.

In the same manner as that of the second embodiment, the magnetic storage device of the present modification includes the reference memory cell array portion 100a and the detection target memory cell array portion 100b. Respective basic configurations of the reference memory cell array portion 100a and the detection target memory cell array portion 100b are the same as the configurations described in the second embodiment.

A location of the reference memory cell block BLKa (RBLK) to which a plurality of reference memory cells belong in the reference memory cell array portion 100a and a location of the detection target memory cell block BLKb to which the detection target memory cell belongs in the detection target memory cell array portion 100b correspond to each other.

In the same manner as that of the second embodiment, the bit line control circuit 300 is commonly used by the reference memory cell array portion 100a and the detection target memory cell array portion 100b that are adjacent to each other in a state where the bit line control circuit 300 is interposed therebetween, and the detection circuit 310 illustrated in FIG. 11 is provided in the common bit line control circuit 300.

A basic read operation of the present modification is the same as the read operation of the second embodiment described above, and data is read in parallel from the reference memory cell array portion 100a and the detection target memory cell array portion 100b. However, in the present modification, the reference value is set based upon data read from a plurality of reference memory cells provided in the reference memory cell block RBLK of the reference memory cell array portion 100a.

In the present modification, it is possible to obtain the effect obtained in the third embodiment and the effect obtained in the second embodiment.

In the above-described third embodiment and modification, the predetermined memory cell block of the plurality of memory cell blocks BLKa1 to BLKa4 provided in the reference memory cell array portion 100a is used as the reference memory cell block RBLK, and the value based upon the plurality of resistance values of the magnetoresistance effect elements provided in the plurality of reference memory cells provided in the reference memory cell block RBLK is used as the reference value, and the plurality of reference memory cells may not be necessarily required to be provided in one memory cell block BLKa. For example, a value based upon a plurality of resistance values of magnetoresistance effect elements provided in a plurality of reference memory cells provided in a different memory cell block BLKa in the reference memory cell array portion 100a may be used as the reference value.

In the first, second, and third embodiments described above, the magnetoresistance effect element is used as the variable resistance memory element, and another variable resistance type memory element can also be used as the variable resistance memory element.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A storage device, comprising:
  a memory cell array in which a plurality of memory cells respectively including a variable resistance memory element are divided into a plurality of memory blocks, the plurality of memory cells including a first memory cell and a second memory cell that are in the same memory block; and
  a detection circuit, wherein
  during a read operation in which the first memory cell is a read target, the detection circuit compares a first resistance value, which is a resistance value of the variable resistance memory element in the first memory cell, with a second resistance value, which is a resistance value of the variable resistance memory element in the second memory cell, and determines a value of data stored in the first memory cell based on whether or not the first resistance value is higher or lower than the second resistance value.

2. The storage device according to claim 1, wherein the memory cells in the memory block of the first and second memory cells are arranged to have a configuration of an array and the second memory cell is located at or near a center of the array.

3. The storage device according to claim 1, wherein the second memory cell has a resistance state set therein and the resistance state in the second memory cell is set to a high or low resistance state according to a number of times reading has been carried out on the second memory cell.

4. The storage device according to claim 1, wherein
the memory block of the first and second memory cells further includes a third memory cell, and
during a read operation in which the third memory cell is the read target, the detection circuit determines a value of data stored in the third memory cell by comparing a resistance value of the variable resistance memory element in the third memory cell with the second resistance value.

5. The storage device according to claim 1, wherein the detection circuit is connected to each of the plurality of memory cells through a respective transistor and includes a first capacitor that is charged in accordance with a resistance state of the variable resistance memory element of the first memory cell when the transistor corresponding thereto is turned on and a second capacitor that is charged in accordance with a resistance state of the variable resistance memory element of the second memory cell when the transistor corresponding thereto is turned on.

6. The storage device according to claim 5, wherein the first resistance value corresponds to an amount of charge in the first capacitor and second resistance value corresponds to an amount of charge in the second capacitor.

7. The storage device according to claim 1, wherein the variable resistance memory element is a magnetoresistance effect element.

8. A storage device, comprising:
a first memory cell array having a plurality of first memory cells respectively including a variable resistance memory element;
a second memory cell array having a plurality of second memory cells respectively including a variable resistance memory element; and
a detection circuit, wherein
during a read operation in which one of the second memory cells is a read target memory cell, the detection circuit compares a first resistance value, which is a resistance value of the variable resistance memory element in the read target memory cell, with a second resistance value, which is a resistance value of the variable resistance memory element in one of the first memory cells that is a reference memory cell, and determines a value of data stored in the read target memory cell based on whether or not the first resistance value is higher or lower than the second resistance value.

9. The storage device according to claim 8, wherein the detection circuit is arranged between the first and second memory cell arrays.

10. The storage device according to claim 9, wherein
the first memory cell array and the second memory cell array have equivalent configurations, and are divided into a plurality of memory blocks, and
the memory block of the reference memory cell and the memory block of the read target memory cell are located a same distance away from the detection circuit.

11. The storage device according to claim 8, wherein
the detection circuit is connected to each of the plurality of first and second memory cells through a respective transistor and includes a first capacitor that is charged in accordance with a resistance state of the variable resistance memory element of one of the first memory cells when the transistor corresponding thereto is turned on and a second capacitor that is charged in accordance with a resistance state of the variable resistance memory element of one of the second memory cells when the transistor corresponding thereto is turned on.

12. The storage device according to claim 11, wherein
the detection circuit turns on the transistor connected to the reference memory cell and the transistor connected to the read target memory cell to charge the first and second capacitors in accordance with the resistance state of the variable resistance memory element in the reference memory cell and the read target memory cell, in parallel.

13. The storage device according to claim 8, wherein the variable resistance memory element is a magnetoresistance effect element.

14. A storage device, comprising:
a plurality of memory cells respectively including a variable resistance memory element, the plurality of memory cells including a plurality of reference memory cells in which a resistance state of the variable resistance memory element therein is set to the same resistance state; and
a detection circuit, wherein
during a read operation performed on one of the memory cells that is a read target memory cell and not one of the reference memory cells, the detection circuit compares a first resistance value, which is a resistance value of the variable resistance memory element in the read target memory cell with a second resistance value, which is based on a plurality of resistance values of variable resistance memory elements in the reference memory cells.

15. The storage device according to claim 14, wherein the second resistance value is an average value of the plurality of resistance values of the variable resistance memory elements in the reference memory cells.

16. The storage device according to claim 14,
wherein the plurality of memory cells are divided into a plurality of memory blocks, one of which includes all of the reference memory cells and does not include the read target memory cell.

17. The storage device according to claim 14, wherein
the plurality of reference memory cells are provided in a first memory cell array, and
the read target memory cell is provided in a second memory cell array.

18. The storage device according to claim 17, wherein the detection circuit is arranged between the first and second memory cell arrays.

19. The storage device according to claim 14, wherein the detection circuit is connected to each of the plurality of memory cells through a respective transistor and includes a first capacitor that is charged in accordance with a resistance state of the variable resistance memory element of one of the memory cells, which are not reference memory cells, when the transistor corresponding thereto is turned on, and a second capacitor for the reference memory cells, which is charged in accordance with a resistance state of the variable resistance memory element of one of the reference memory cells when the transistor corresponding thereto is turned on.

20. The storage device according to claim 14,
wherein the variable resistance memory element is a magnetoresistance effect element.

* * * * *